(12) United States Patent
Dupuy et al.

(10) Patent No.: US 10,348,295 B2
(45) Date of Patent: Jul. 9, 2019

(54) PACKAGED UNIDIRECTIONAL POWER TRANSISTOR AND CONTROL CIRCUIT THEREFORE

(71) Applicant: FREESCALE SEMICONDUCTOR, INC., Austin, TX (US)

(72) Inventors: Philippe Dupuy, Toulouse (FR); Hubert Michel Grandy, Lespine (FR); Laurent Guillot, Seysses (FR)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/132,855

(22) Filed: Apr. 19, 2016

(65) Prior Publication Data

US 2017/0149430 A1 May 25, 2017

(30) Foreign Application Priority Data

Nov. 19, 2015 (WO) .................. PCT/IB2015/002372

(51) Int. Cl.
*H03K 17/56* (2006.01)
*H03K 17/687* (2006.01)
(Continued)

(52) U.S. Cl.
CPC ....... *H03K 17/687* (2013.01); *H01L 29/1095* (2013.01); *H01L 29/7827* (2013.01); *H03K 17/08104* (2013.01); *H03K 17/74* (2013.01)

(58) Field of Classification Search
CPC . H01L 2924/00; H05B 33/0815; H05B 39/04; H05B 39/048
See application file for complete search history.

(56) References Cited

U.S. PATENT DOCUMENTS 4,656,493 A 4/1987 Adler et al.
5,420,451 A 5/1995 Williams et al.
(Continued)

FOREIGN PATENT DOCUMENTS

EP 1887698 A2 2/2008
EP 2533246 A1 12/2012
(Continued)

OTHER PUBLICATIONS

Extended Search Report for application 15199239.3 dated Jul. 7, 2016.
(Continued)

*Primary Examiner* — Sibin Chen

(57) ABSTRACT

A packaged unidirectional power transistor comprises a package with a number of pins which provide a voltage and/or current connection between the outside and the inside. Inside the package, a bidirectional vertical power transistor is present with a controllable bidirectional current path, through a body of the bidirectional vertical power transistor, between a first current terminal of the bidirectional vertical power transistor connected to the first current pin and a second current terminal of the bidirectional vertical power transistor connected to the second current pin. A control circuit connects the control pin to the body terminal and the control terminal to drive the body and the control terminal, which allows current through the body in a forward direction, from the first current terminal to the second terminal, as a function of the control voltage, and to block current in a reverse direction regardless of the voltage.

20 Claims, 4 Drawing Sheets

(51) Int. Cl.
*H01L 29/78* (2006.01)
*H01L 29/10* (2006.01)
*H03K 17/081* (2006.01)
*H03K 17/74* (2006.01)

(56) References Cited

U.S. PATENT DOCUMENTS

| | | | |
|---|---|---|---|
| 5,488,862 A | 2/1996 | Neukermans et al. | |
| 5,682,050 A * | 10/1997 | Williams | H01L 29/78 257/368 |
| 5,767,733 A | 6/1998 | Grugett | |
| 5,770,883 A | 6/1998 | Mizuno et al. | |
| 5,850,042 A | 12/1998 | Warren | |
| 5,914,801 A | 6/1999 | Dhuler et al. | |
| 5,945,708 A | 8/1999 | Tihanyi | |
| 6,043,965 A | 3/2000 | Hazelton et al. | |
| 6,049,108 A | 4/2000 | Williams et al. | |
| 6,096,608 A | 8/2000 | Williams | |
| 6,215,137 B1 | 4/2001 | Suzuki et al. | |
| 6,433,401 B1 | 8/2002 | Clark et al. | |
| 6,650,520 B2 | 11/2003 | He | |
| 6,781,195 B2 | 8/2004 | Wu et al. | |
| 6,943,408 B2 | 9/2005 | Wu et al. | |
| 7,019,231 B2 | 3/2006 | Ishikawa et al. | |
| 7,280,014 B2 | 10/2007 | Potter | |
| 7,282,406 B2 | 10/2007 | Grivna et al. | |
| 7,283,343 B2 | 10/2007 | Grose et al. | |
| 7,297,603 B2 | 11/2007 | Robb et al. | |
| 7,352,036 B2 | 4/2008 | Grebs et al. | |
| 7,508,277 B2 | 3/2009 | Kuo et al. | |
| 7,537,970 B2 | 5/2009 | Robb et al. | |
| 7,605,435 B2 | 10/2009 | Anderson et al. | |
| 7,807,536 B2 | 10/2010 | Sreekantham et al. | |
| 7,910,409 B2 | 3/2011 | Robb et al. | |
| 8,049,287 B2 | 11/2011 | Combi et al. | |
| 8,049,568 B2 | 11/2011 | Youssef et al. | |
| 8,101,969 B2 | 1/2012 | Robb et al. | |
| 8,120,984 B2 | 2/2012 | Huang et al. | |
| 8,247,867 B2 | 8/2012 | Nakata et al. | |
| 8,269,263 B2 | 9/2012 | Li et al. | |
| 8,304,275 B2 | 11/2012 | Schlarmann et al. | |
| 8,431,989 B2 | 4/2013 | Bhalla et al. | |
| 8,530,284 B2 | 9/2013 | Robb et al. | |
| 8,541,833 B2 | 9/2013 | Schulze et al. | |
| 8,642,425 B2 | 2/2014 | Burke et al. | |
| 8,648,432 B2 | 2/2014 | Haeusler | |
| 8,653,587 B2 | 2/2014 | Hsieh | |
| 8,907,394 B2 | 12/2014 | Hossain | |
| 8,947,156 B2 | 2/2015 | Stultz et al. | |
| 9,123,559 B2 | 9/2015 | Meiser et al. | |
| 9,159,786 B2 | 10/2015 | Chen | |
| 9,269,779 B2 | 2/2016 | Deng et al. | |
| 9,443,845 B1 | 9/2016 | Stafanov et al. | |
| 9,446,940 B2 | 9/2016 | Dawson et al. | |
| 9,458,008 B1 | 10/2016 | Dawson et al. | |
| 9,472,662 B2 | 10/2016 | Stefanov et al. | |
| 9,559,198 B2 | 1/2017 | Stefanov et al. | |
| 2001/0043112 A1 | 11/2001 | Voldman | |
| 2005/0172717 A1 | 8/2005 | Wu et al. | |
| 2006/0267161 A1* | 11/2006 | Thompson | H01L 23/49524 257/666 |
| 2007/0004116 A1 | 1/2007 | Hshieh | |
| 2007/0108511 A1 | 5/2007 | Hirler | |
| 2007/0205431 A1 | 9/2007 | Robb et al. | |
| 2008/0016683 A1 | 1/2008 | Brida et al. | |
| 2008/0023473 A1 | 1/2008 | Spyros et al. | |
| 2008/0111642 A1 | 5/2008 | Bohorquez | |
| 2008/0121995 A1 | 5/2008 | Anderson et al. | |
| 2008/0290430 A1 | 11/2008 | Mahadevan et al. | |
| 2009/0261446 A1 | 10/2009 | Gogoi | |
| 2010/0019393 A1 | 1/2010 | Hsieh et al. | |
| 2010/0031077 A1* | 2/2010 | Swoboda | G01R 31/318538 713/400 |
| 2010/0187602 A1 | 7/2010 | Woolsey et al. | |
| 2010/0315938 A1 | 12/2010 | Ascanio et al. | |
| 2011/0127573 A1 | 6/2011 | Robb et al. | |
| 2012/0025305 A1 | 2/2012 | Takeda | |
| 2012/0049187 A1 | 3/2012 | Haruyama et al. | |
| 2012/0083075 A1 | 4/2012 | Robb et al. | |
| 2012/0175635 A1 | 7/2012 | Weis et al. | |
| 2012/0326227 A1 | 12/2012 | Burke et al. | |
| 2013/0187196 A1 | 7/2013 | Kadow | |
| 2013/0214365 A1 | 8/2013 | Schlarmann et al. | |
| 2013/0249602 A1 | 9/2013 | Mauder et al. | |
| 2013/0344667 A1 | 12/2013 | Qin et al. | |
| 2014/0009212 A1 | 1/2014 | Altunkilic et al. | |
| 2014/0021484 A1 | 1/2014 | Siemieniec et al. | |
| 2014/0084362 A1 | 3/2014 | Schloesser et al. | |
| 2014/0252512 A1 | 9/2014 | Yang et al. | |
| 2014/0367773 A1 | 12/2014 | Poelzl | |
| 2015/0028416 A1 | 1/2015 | Zundel et al. | |
| 2015/0069610 A1 | 3/2015 | Grivna | |
| 2015/0102403 A1 | 4/2015 | Kuruc et al. | |
| 2015/0115387 A1 | 4/2015 | Buckley et al. | |
| 2015/0145030 A1 | 5/2015 | Meiser et al. | |
| 2015/0162324 A1 | 6/2015 | Mauder et al. | |
| 2015/0194915 A1 | 7/2015 | Mulliken | |
| 2016/0051131 A1 | 2/2016 | Jeong et al. | |
| 2016/0126348 A1 | 5/2016 | Deng et al. | |
| 2016/0159642 A1 | 6/2016 | Hooper et al. | |
| 2016/0163849 A1 | 6/2016 | Dupuy et al. | |

FOREIGN PATENT DOCUMENTS

| | | |
|---|---|---|
| EP | 2 779 455 A1 | 9/2014 |
| WO | 95/30277 A1 | 11/1995 |
| WO | 00/19540 A1 | 4/2000 |
| WO | WO-2007/008934 A1 | 1/2007 |
| WO | 2015028838 A1 | 3/2015 |

OTHER PUBLICATIONS

U.S. Appl. No. 14/870,333, filed Sep. 30, 2015 entitled "Bidirectional Power Transistor With Shallow Body Trench" Office Action—Restriction on Mar. 22, 2016.

U.S. Appl. No. 14/870,333, filed Sep. 30, 2015 entitled "Bidirectional Power Transistor With Shallow Body Trench" Office Action—Notice of Allowance on Jun. 13, 2016.

U.S. Appl. No. 14/870,311, filed Sep. 30, 2015 entitled "Transistor Body Control Circuit and an Integrated Circuit" Office Action—Notice of Allowance on May 16, 2016.

U.S. Appl. No. 14/870,311, filed Sep. 30, 2015 entitled "Transistor Body Control Circuit and an Integrated Circuit" Office Action—Notice of Allowance on Aug. 1, 2016.

U.S. Appl. No. 14/870,311, filed Sep. 30, 2015 entitled "Transistor Body Control Circuit and an Integrated Circuit".

U.S. Appl. No. 14/870,333, filed Sep. 30, 2015 entitled "Bidirectional Power Transistor With Shallow Body Trench".

Final Office Action mailed Feb. 19, 2016 for U.S. Appl. No. 14/564,340, 15 pages.

Non-Final Office Action mailed Jun. 16, 2016 for U.S. Appl. No. 14/564,340, 15 pages.

Non-Final Office Action mailed Sep. 14, 2015 for U.S. Appl. No. 14/564,340, 13 pages.

Arzumanyan, A. et al. "Flip Chip Power MOSFET: A New Wafer Scale Packaging Technique," Proceedings of 2001 International Symposium on Power Semiconductor Devices and I.C.'s, Osaka, JP; pp. 251-254; Jun. 2001.

Robb, F. et al., "A New P-channel Bidirectional Trench Power MOSFET for Battery Charging and Protection," Proceedings of 22nd International Symposium on Power Semiconductor Devices and I.C.'s, Hiroshima, JP; pp. 405-408; Jun. 2010.

Sawada, M. et al., "High side n-channel and bidirectional Trench Lateral Power MOSFETs on one chip for DCDC converter I.C.s," Proceedings of the 20th International Symposium on Power Semiconductor Devices and I.C.s, Orlando, FL; May 2008.

Non-Final Rejection mailed Aug. 25, 2016 for U.S. Appl. No. 14/707,150, 28 pages.

(56) References Cited

OTHER PUBLICATIONS

Final Office Action mailed Jun. 16, 2016 for U.S. Appl. No. 14/506,037, 8 pages.
Non-Final Office Action mailed Jan. 21, 2016 for U.S. Appl. No. 14/506,037, 8 pages.
Notice of Allowance mailed Jul. 29, 2016 for U.S. Appl. No. 14/506,037, 8 pages.
Notice of Allowance mailed Sep. 8, 2016 for U.S. Appl. No. 14/870,333, 9 pages.
Ex parte Quayle Action mailed Jun. 24, 2016 for U.S. Appl. No. 14/658,598, 5 pages.
Notice of Allowance mailed Aug. 10, 2016 for U.S. Appl. No. 14/658,598, 5 pages.
Restriction Requirement mailed Mar. 1, 2016 for U.S. Appl. No. 14/658,598, 5 pages.
U.S. Appl. No. 14/994,197, filed Jan. 13, 2016.
U.S. Appl. No. 14/912,346, Inventor Evguenly Nikolov Stefanov et al., "Semiconductor Device and Method of Manufacture Therefor", filed Aug. 27, 2013, Office Action—Notice of Allowance mailed Oct. 3, 2016.
U.S. Appl. No. 14/912,346, Inventor Evguenly Nikolov Stefanov et al., "Semiconductor Device and Method of Manufacture Therefor", filed Aug. 27, 2013, Office Action—Notice of Allowance mailed Dec. 7, 2016.
Final Office Action dated Apr. 18, 2017 for U.S. Appl. No. 14/707,150, 33 pages.
Non-Final Rejection dated Jul. 31, 2018 for U.S. Appl. No. 15/600,961, 13 pages.
U.S. Appl. No. 15/600,961, filed May 22, 2017 entitled "Circuit Arrangement for Fast Turn-Off of Bi-Directional Switching Device".

\* cited by examiner

PACKAGED UNIDIRECTIONAL POWER TRANSISTOR AND CONTROL CIRCUIT THEREFORE

CROSS REFERENCE TO RELATED APPLICATION(S)

The present application claims priority to International Patent Application No. PCT/IB2015/002372, entitled "A PACKAGED UNIDIRECTIONAL POWER TRANSISTOR AND CONTROL CIRCUIT THEREFORE," filed on Nov. 19, 2015, the entirety of which is herein incorporated by reference.

FIELD OF THE INVENTION

This invention relates to power transistors, such as vertical field effect transistors, and more specifically to packaged power transistors and control circuits for packaged power transistors.

BACKGROUND OF THE INVENTION

Power transistors, such as power FETs (field effect transistor) are commonly used due to their low gate drive power, fast switching speed and superior paralleling capability. Most power FETs feature a vertical structure with source and drain on opposite sides of the wafer in order to support higher current and voltage, although lateral power MOSFETs exists as well. However, in order to have a unidirectional circuit, i.e. which has a controllable current in a forward direction and effectively blocks all current in a reverse direction, a so called back-to-back configuration of two power transistors is required. This is caused by the high reverse current leakage known power transistors exhibit, and more specifically the poor blocking of source-drain current exhibited by power FETs.

SUMMARY OF THE INVENTION

The present invention provides a packaged unidirectional power transistor and a control circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

Figure 1:
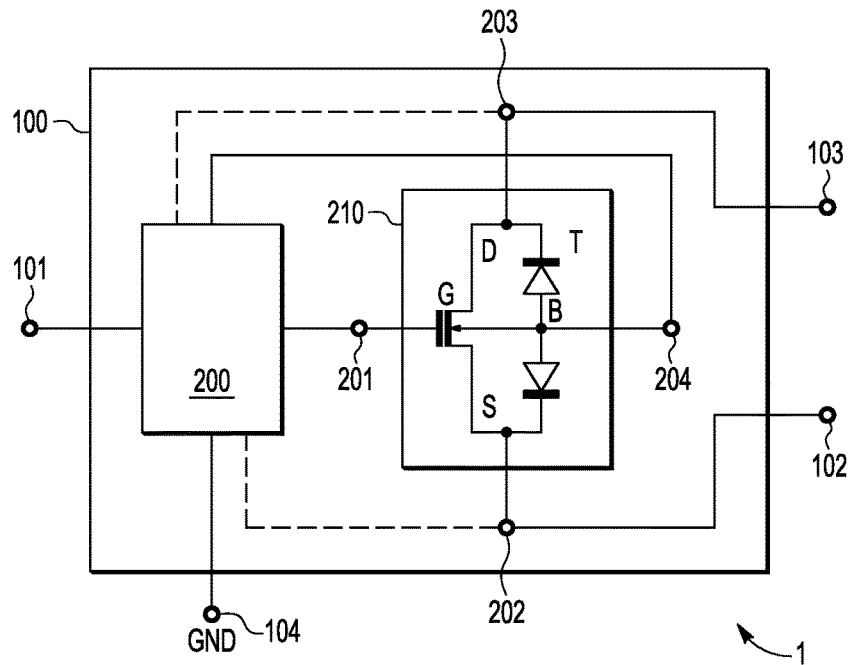
FIG. 1 schematically shows a block diagram of an example of an embodiment of a packaged unidirectional power transistor.
Figure 2:
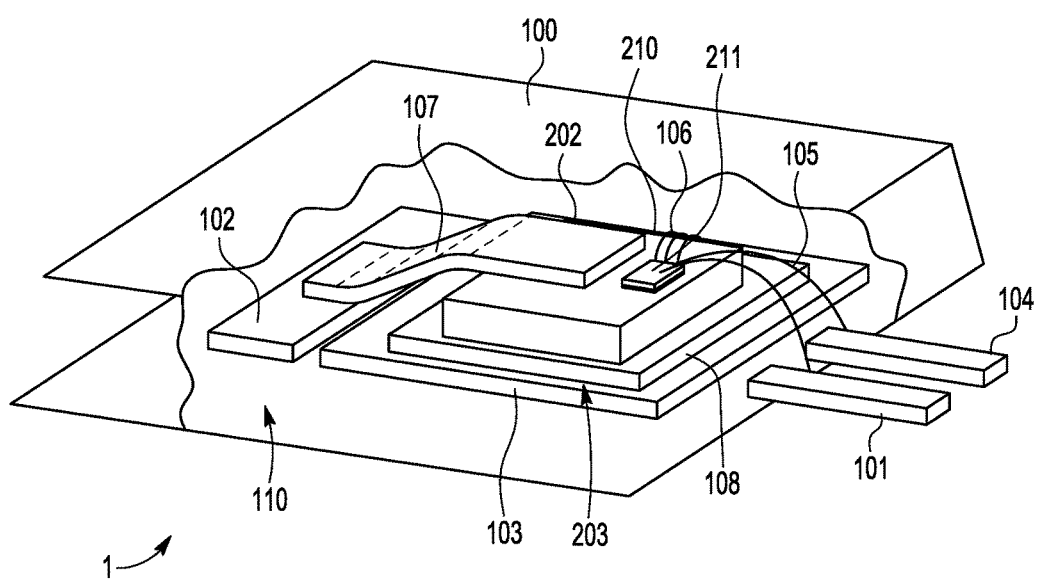
FIG. 2 schematically shows an opened perspective view of an example of an embodiment of a packaged unidirectional power transistor.

Referring to FIGS. 1 and 2, the example of a packaged unidirectional power transistor 1 shown therein comprises a package or casing 100, e.g. made from epoxy or other suitable packaging material, with a number of pins 101-104, also referred to as leads, at an outside of the package. The pins 101-104 comprise a control pin 101, a first current pin 102 and a second current pin 103. The package may have just those pins. However it will be apparent that, as shown in this example, further pins may be present such as a ground pin 104 connectable to ground GND.

Inside the package 100, a bidirectional vertical power transistor T is present, (represented by a power FET in parallel with two diodes connected anode-to-anode, the diodes representing the junctions between the transistor body and its drift layers) as well as a control circuit 200 therefore. As can be seen in more detail in FIG. 3 and explained below in more detail with reference thereto, the bidirectional vertical power transistor T has a controllable bidirectional current path P, through its body B, between a first current terminal 202 and a second current terminal 203. The first current terminal 202, e.g. a source S of the bidirectional vertical power transistor, is connected to the first current pin 102. The second current terminal 203, e.g. a drain D of the bidirectional vertical power transistor, is connected to the second current pin 103. As shown, the bidirectional vertical power transistor T comprises a body terminal 204 for controlling a voltage applied to the body B. The bidirectional vertical power transistor further has a control terminal 201, connected to e.g. a gate G, for selectively opening and closing the current path P by a control voltage applied to the control terminal.

Figure 7:
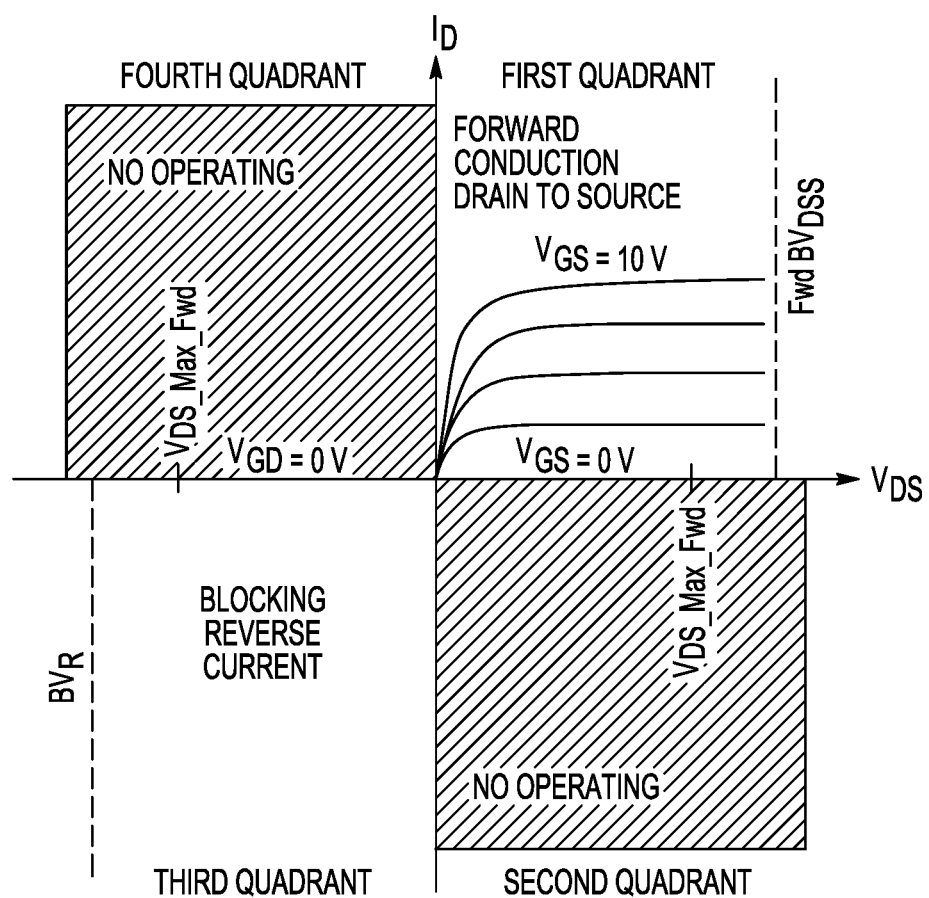
FIG. 7 shows a graph of the voltage-current characteristics of a packaged unidirectional power transistor.

The control circuit 200 connects a control pin 101 to the body terminal 204 and the control terminal 201 and, when the unidirectional power transistor is in operation, drives the body B and the control terminal 201. The control circuit 200 controls, via the body B and the control terminal 201, the bidirectional current path P to be open in a forward direction, from the first current terminal 202 to the second terminal 203, and to be controllable as a function of the control voltage applied at the control terminal 201. The control circuit 200 thus allows a controlled current flow through the body in the forward direction, as a function of the control voltage applied at the control terminal 201. In this example for instance, the current path P becomes more conductive if the magnitude of the control voltage increases, up to a saturation level where the conductivity remains constant at increasing control voltage, as shown in FIG. 7. The control circuit 200 controls, via the body B and the control terminal 201, the bidirectional current path P to be closed and to block current flow in a reverse direction, reverse to the forward direction, independent of the control voltage. Thereby, the packaged unidirectional power transistor 1 exhibits an effective blocking of reverse current, as is illustrated in the third quadrant of the graph in FIG. 7.

It will be apparent that the control circuit 200 may be connected to other terminals and that the unidirectional power transistor 1 may have additional pins connected to the control circuit 200. For example, as illustrated with the dashed lines in FIG. 1, the control circuit 200 may further be connected to the first current terminal 202 and/or the second current terminal 203, e.g. to control the body and control terminal as a function of the voltage applied to the first current terminal 202 and/or the second current terminal 203, e.g. for example as a function of the voltage difference between first current terminal 202 and the control terminal 201, or between the second current terminal 203 and the control terminal 201, such as in the example of FIG. 4.

The bidirectional vertical power transistor T can support high energies, i.e. high currents and/or voltages both from the first current terminal to the second terminal, e.g. source towards the drain, and vice-versa, e.g. drain D towards source S. The bidirectional vertical power transistor can for example have a current maximum of more than 1 A, such as 10 A or more, such as 100 A or more, such as at least 200 A and/or a positive breakdown voltage of at least 25 V, for example 50 V or more, and a negative breakdown voltage of at least 25 V, for example 30 V or more, such as 50 V or more, for example 100 V or more, e.g. 200 V or more.

Figure 3:
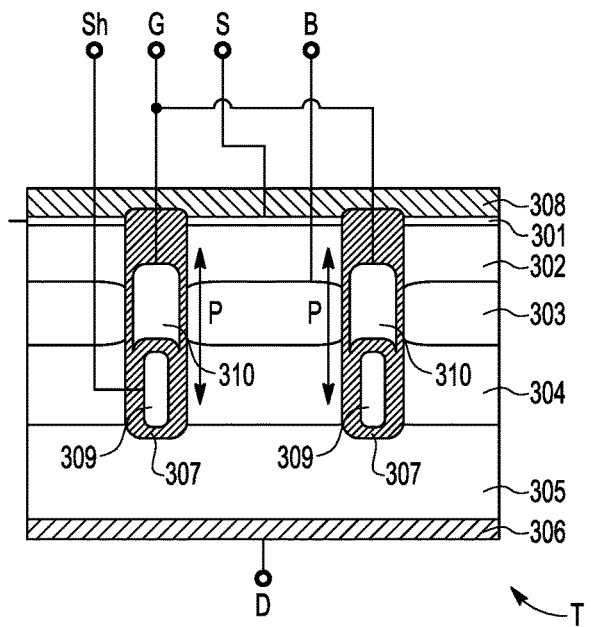
FIG. 3 shows a cross-sectional view of a bidirectional vertical power transistor.

In FIG. 3 a cross-sectional view is shown to explain the bidirectional operation of the bidirectional vertical power transistor T. It should be apparent that in FIG. 3 only a single transistor or "cell" is shown, and that an actual semiconductor product can comprise an arrangement of a plurality of these cells (e.g. seen from above multiple fingers may be positioned next to each other). Depending on the specific implementation, the semiconductor product can comprise several tens, hundreds, thousands or more cells in a suitable arrangement (e.g. 2-dimensional matrix or in an array) and connected in parallel to form a single power transistor device. The semiconductor product can for example be implemented as described in the applicant's co-pending International Patent Application PCT/IB2013/002209, the entire contents of which are incorporated herein by reference. In case the semiconductor product comprises a plurality of cells, the terminals of each of the different cells can be connected to the electrodes, to allow the different cells to be controlled simultaneously to conduct current through a layer stack from a first current terminal to a second current terminal or vice versa.

It should further be noted that, seen from a top view, the transistor has an elongated finger like shape and that the different electrodes may connect to the respective element at a location of the finger suitable for the specific implementation and not necessarily at the section shown in FIG. 3. E.g. the body 303 may be connected at opposite ends of the finger to the body electrode B, the source 301 to the source electrode S at the opposite ends of the finger and a position in the middle of the finger, etc.

Still referring to FIG. 3, a stack of suitably patterned and structured layers 301-306 has been provided and the bidirectional vertical power transistor T is formed in the layer stack e.g. by processing, such as successive patterning, doping, deposition, etching, etc. of the stack. The layer stack comprises, from the bottom surface until the top surface of the stack: a drain electrode layer 306 at a backside of a wafer level semiconductor substrate 305. At the frontside or top of the substrate 305, the stack comprises (in order from bottom to top): a first drift layer 304, a body layer 303, a second drift layer 302, and a source layer 301. The top surface of the layer stack is covered by a passivation layer 308 of a suitable dielectric material which shields the rest of the power transistor T from ambient influences, such as oxidation or otherwise. The bidirectional vertical power transistor is defined in the horizontal direction, i.e. parallel to substrate 305, by vertical trenches 307 extending from a top surface of the stack onto, and in the example into a recess of the substrate. The vertical trenches are provided with a gate 310 and a shield plate 309.

The bidirectional vertical power transistor shown in FIG. 3 is a bidirectional field effect transistor with trenches, also known as a bidirectional vertical trench FET, and has a first current terminal a source electrode S, and as a second current terminal a drain electrode D. An electrical path P is present between the first current terminal and the second current terminal, through the first drift region 304, the body 303 and the second drift region 302. The electrical path P can be selectively enabled or disabled to allow current to flow in a first direction, e.g. from the first current terminal to the second terminal or a second direction, opposite to the first direction, by applying suitable signals and power to the electrodes B, D, G, Sh and S, which are respectively connected to body 303, drain 306, gate 310, shields 307 and source 301 of the power transistor T.

On the die on which the bidirectional vertical power transistor is present, the drain electrode D is connected to the second current terminal 203 and the source electrode S is connected to the first current terminal 202 of the bidirectional vertical power transistor shown. The gate or control electrode G is connected to the control terminal 201. As shown in the example of FIG. 3, the bidirectional vertical power transistor can further comprise a body electrode B connectable to an external power supply and connected to the body layer 303 of the bidirectional vertical power transistor T. A separate shield electrode Sh is provided via which the voltage of shield plates 309 can be controlled separately from the voltage and/or current of the other electrodes. However, the source electrode S can alternatively be connected to the shield plate 309 of each of the power transistors 100 and hence the voltage of the shield plate be coupled to the first current terminal.

The bidirectional vertical power transistor T can be used to control the flow of current. The shown example of power transistor can for example be used in a method for operating a power transistor as described below, although it will be apparent that other types of bi-directional vertical power transistors can be used as well to perform such a method and that the bi-directional vertical power can be used in other methods. The power transistor can be operated intermittently in a first direction or a second direction, i.e. bi-directional. The bi-directional vertical power transistor can be symmetric with positive and negative break down voltages that have the same absolute value, or be asymmetric, with different values, depending on the specific implementation. For instance, depending on the specific implementation the thickness of the first and/or second drift region can be adapted to obtain a breakdown voltage for the specific implementation. For an asymmetric transistor, a suitable positive breakdown voltage has found to be between 1.5 and 2 times that of the negative breakdown voltage, such as 45 V for a 25 V negative breakdown voltage.

The bi-directional nature of the bidirectional vertical power transistor T will now be described in operation, using the example of an n-type power transistor. In a first direction and in respect of switching the bidirectional vertical power transistor T on, a positive voltage (relative to the source) can be applied to the drain electrode D. The body electrode B can be connected to the source electrode S, so as to electrically couple the body 303 to the source 301 of the transistor T, as explained below in more detail with reference to the operation of the circuits shown in FIG. 5. To the shield plate a voltage lower than the voltage of the drain electrode (e.g. 0 V or the source voltage if the drain electrode is at a positive voltage) can then be provided to shield the gate from the voltage applied to the drain electrode D. Applying a positive gate-source bias voltage, Vgs>0 V, to the gate electrode G causes a depletion field effect through the gate dielectric at an interface between the body 303 and the trenches 307 in which the gate 310 is provided. Vgs can for instance be provided by an external gate driver circuit GD (such as shown in FIG. 6) connected to the gate electrode G. When the gate-source bias voltage exceeds a threshold voltage Vth, an inversion conducting n-layer is formed along the interface of the trench 307 and the body 303, which conducts the majority of carriers injected from the source 301 to be collected by the drain 306. This results in the current path being opened and current flowing through the path.

When a positive voltage is applied to the drain 306 and in an off-state of the bidirectional vertical power transistor T, the body 303 can still be electrically tied to the source and so be subjected to a source potential. The gate bias voltage can be set to a lowest potential, e.g. Vgs=0 V. As a result, a first depletion layer is formed around a bottom p-n junction formed by the interface of the body 303 and the first drift region 304. By increasing the drain-source bias voltage, Vds, a first space charge region of the depletion layer can increase to the low-doped bottom part of the first drift region 304. The electrical field in the region thereby increases and when a critical field is reached, an avalanche phenomena by carrier impact ionization can be observed causing breakdown of the reverse biased junction mentioned above.

In the second direction a positive voltage (relative to the drain) can be applied to the source 301. In the on-state, the body electrode can be set such that the drain potential is coupled to the body 303. In the second direction, a positive bias voltage, e.g. the source voltage, can be provided to the shield plate and the gate biased relative to the drain 306. This allows to reduce the electrical field in at least a part of the first drift region 304, and accordingly the breakdown voltage can be increased. A positive gate bias voltage, Vgd>0 V, can be applied to the gate by the external gate driver circuit, thereby causing a depletion field effect through the gate dielectric into the body along the inner sidewalls of the trenches 307. When the gate bias voltage exceeds the threshold voltage Vth an inversion conducting layer can be formed along the interface of the trench dielectric and the body, which can conduct the majority of the carriers injected from the substrate 305 and collected by the source 301.

In the second direction and in an off state, the body 303 can still be electrically tied to the potential of the drain and a positive voltage (relative to the drain) be applied to the source 301. The gate-drain bias voltage, Vgd, can be set to the lowest potential, namely, Vgd=0V. A second depletion layer can be formed around a top p-n junction formed by the interface of the body and the first drift region 302. By increasing the source-drain bias voltage, Vsd, a second space charge region of the depletion layer can increase to the low-doped top part of the first drift region 302 thus effectively blocking the current flow. The electrical field in the region can thereby increase and when a critical field is reached, an avalanche phenomena by carrier impact ionization can be observed causing breakdown of the reverse biased junction mentioned above, thereby implementing the blocking voltage.

It will be apparent that each of the electrodes or feeds of the transistor, such as electrodes B, D, G, Sh and S those shown in FIG. 3 is connectable to external circuitry, such as a power supply or control logic circuitry, through the terminals 201-204 provided on the die. The connection between the electrodes and the terminals can be provided in any conventional manner, e.g. using metal connections on an interconnect layer of the die.

The terminals 201-204 may be connectable to the components outside the package in any suitable manner. Referring back to FIGS. 1 and 2, for instance, as shown the pins or leads 101-104 are partly exposed to the exterior of the package to e.g. allow them to be soldered to a printed circuit board or otherwise electrically connect them to other parts of an electrical system. The pins 101-104 extend into to an inside 110 of the package 100 and are connected to terminals 201-204 on the semiconductor die or dices inside the package to provide a voltage and/or current connection between the outside and the inside 110. In the shown example, the pins are formed by leads of a lead frame, of which power leads 102,103 are located at the bottom side of the package and exposed at their bottom surface whereas the low voltage control pins 101, 104 protrude at the sides of the package.

The terminals 201-204 are connected to the pins or leads 101-104 in various manners. The control terminal 201 is connected via an inter-die bondwire 106 to a corresponding terminal of a control circuit, which in turn is connected to the control pin 101 via a die-to-pin bondwire 105. The first current terminal 202 is in this example at a topside of the die and connected via an electrically conductive clip attach 107, e.g. from copper or another metal, to a first current pin 102, which in this example is an exposed plate at the bottom of the package. The exposed plate and clip attach are sufficiently large to handle the current and voltages of the bidirectional vertical power transistor. The second current terminal 203 is provided at a bottom side of the die and attached to an exposed plate, in this example a lead frame substrate, via an electrically and thermally conducting die attach material 108. In this example the entire die is attached to that plate.

In the examples shown, the packaged unidirectional power transistor comprises two semiconductor dices 200, 210. The bidirectional vertical power transistor is provided on a power die 210 and the control circuit 200 is provided on a control die 211. In the example of FIGS. 1 and 2, the bidirectional vertical power transistor T is provided on a power die 210 which is placed inside the package and the control circuit 200 is provided on a separate control die connected to the power die, e.g. via bondwires or other suitable inter-die connectors. More specifically, the power die and the control dice are in a stacked configuration, with the dies on top of each other. The control die in the example is significantly smaller than the power die and attached to the power die with a suitable die attach material, such as film/paste. However, it will be apparent that the bidirectional vertical power transistor T and the control circuit 200 may alternatively be implemented on the same die or that more than two dices may be present.

In the shown example, the packaged unidirectional power transistor is a discrete transistor, that is: treating the package as a black-box the appearance is that of a stand-alone transistor with pins for gate, drain, source and ground and the packaged unidirectional power transistor is controlled and behaves as a stand-alone transistor. However, it will be apparent that inside the package further circuitry for controlling the bidirectional vertical power transistor may be provided to e.g. provide a state-machine that controls the bidirectional vertical power transistor or provides other control, protective or diagnostic functions and that additional pins may or may not be present, such as data input/output pins. For example, the further circuitry can be configurable and/or programmable and the pins comprise one or more than one additional pin, additional to the control pin and the first and second current pins, connected to the further circuitry to configure and/or program the further circuitry, e.g. to configure a pulse width modulation duty cycle, configure load control conditions or otherwise, transmit transistor diagnostic data or otherwise.

Figure 4:
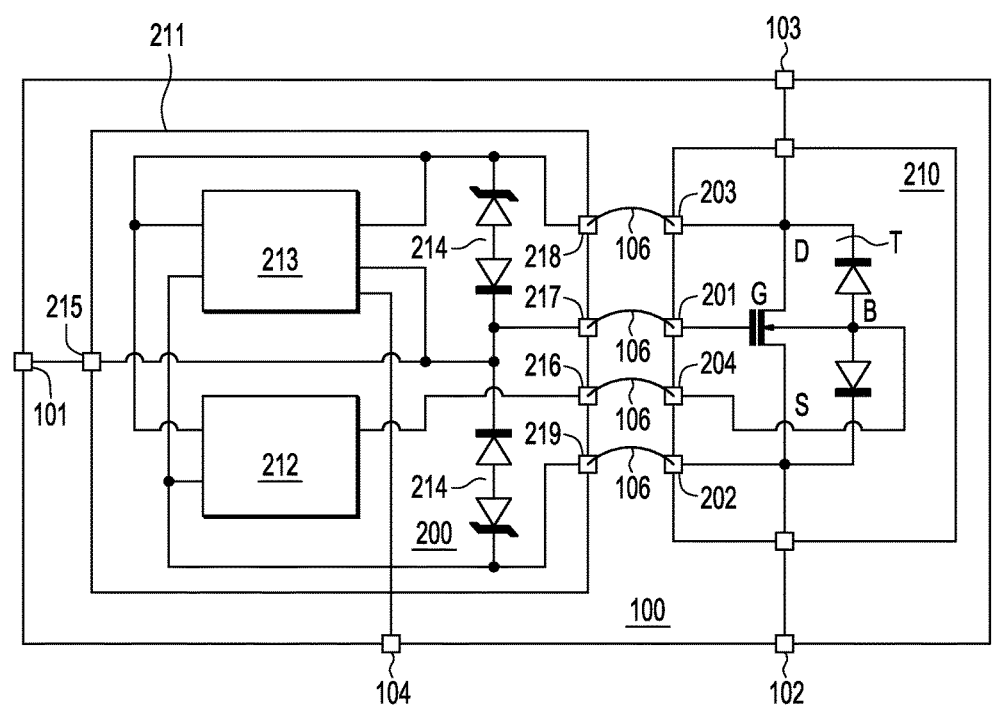
FIG. 4 schematically shows block diagram of an example of an embodiment of a control circuit suitable for a unidirectional power transistor.

Referring to FIG. 4, the block diagram shown therein comprises, in addition to a bidirectional vertical power transistor T a control circuit 200 for a unidirectional power transistor. In this example the transistor is located on a different die 210 and connected to the die 211 on which the control circuit 200 is present. As shown, the control circuit 200 is connectable to the bidirectional vertical power transistor via inter-die connections, such as bondwires 106 in the example. The control circuit 200 comprises a control input 215 for receiving a transistor control signal. In the example, the control input 215 is connectable to the control pin 101 which allows a control signal to be provided from outside the package. A body contact 216 of the control circuit 200 is connectable to the body terminal 204 of the bidirectional vertical power transistor T. A control contact 217 of the control circuit 200 is connectable to the control terminal 201 of the bidirectional vertical power transistor T. The control circuit 200 further comprises a first terminal contact 218 connectable to the second terminal 203 of the bidirectional vertical power transistor, and a second terminal contact 219 connectable to the first terminal 202.

The control circuit comprises a body control circuit 212 connected to the control input 101 and the body contact 216, for providing at the body contact a body drive signal. The body drive signal drives the body to allow current flow through the body in a forward direction from the first current terminal to the second terminal as a function of a control voltage of the control terminal and to block current flow in a reverse direction reverse to the forward direction regardless of the control voltage. As explained below in more detail, in this specific example the body control circuit 212 allows a fast driving of the body potential to the source terminal when the drain-to-source voltage Vds is positive and allows a fast driving of the body potential to the drain terminal when the drain-to-source voltage Vds is negative.

In the shown example, the body control circuit 212 is connected to the first terminal contact 218 and the second terminal contact 219 and comprises a voltage detector to detect the polarity of a voltage between the first terminal and the second terminal and to control the body as a function of the polarity. For example a junction in the body (e.g. between body and first or second drift zone) may be forward or reverse biased. The junction, when reverse biased, blocks the current flow in the reverse direction.

The body control circuit 212 may for example when the drain voltage is positive relative to the source of the bidirectional vertical power transistor, electrically couple the body 303 to the source 301 of the bidirectional vertical power transistor T. This allows a current in the first direction (from drain to source in the example) controllable by the voltage applied to the gate, as explained above with reference to FIG. 3 and as illustrated in FIG. 7 operates the transistor 100 in the first quadrant. When the drain voltage is negative relative to the source, the body control circuit 212 may set the body 303 to the drain potential. As a consequence a depletion layer is formed around a top p-n junction formed by the interface of the body and the first drift region 302. By increasing the source-drain bias voltage, Vsd, a second space charge region of the depletion layer can increase to the low-doped top part of the first drift region 302. As long as the gate-drain voltage is maintained at 0 V the bidirectional vertical power transistor will block current and the packaged unidirectional power transistor 1 exhibits an effective blocking of reverse current (from source to drain in the example), as is illustrated with the graph in FIG. 7 in the third quadrant.

As shown, the control circuit further comprises a transistor control driver 213 connected to the control input, for driving the control terminal based on the control signal provided at the control input. The transistor control driver 213 pulls the gate-drain voltage of the bidirectional vertical power transistor to be 0 in case the drain voltage is negative relative to the source of the bidirectional vertical power transistor, i.e. the current is blocked when the packaged unidirectional transistor is in reverse and in case the voltage is negative relative to the ground 104. In case the drain voltage is positive relative to the source (or to the ground), the transistor control driver isolates the gate from the drain and hence allows to control of the gate voltage and to control the bidirectional current path P through the bidirectional vertical power transistor as explained above with reference to FIG. 3 and the first quadrant indicated in FIG. 7. Thus when the packaged unidirectional transistor is in forward mode, the current from drain to source, through the transistor, can effectively be controlled by the control voltage applied to the gate.

As illustrated with the I-V characteristics in FIG. 7, the example shown in FIG. 4 allows to operate the packaged unidirectional power transistor to be in the first (i.e. with a positive drain-source potential and positive drain current) and in the third quadrant ((i.e. with a negative drain-source potential and negative drain current). Furthermore, the example shown in FIG. 4 allows to ensure that in the third quadrant the gate-drain voltage is for practical purposes 0 V and the current through the bidirectional vertical power transistor is not more than a (small) leakage current, e.g. is for practical purposes 0 A. Additionally, as illustrated in FIG. 7, when in the first quadrant the example allows to control the gate independent from the drain voltage and hence to operate the unidirectional transistor as a classic transistor.

Figure 5:
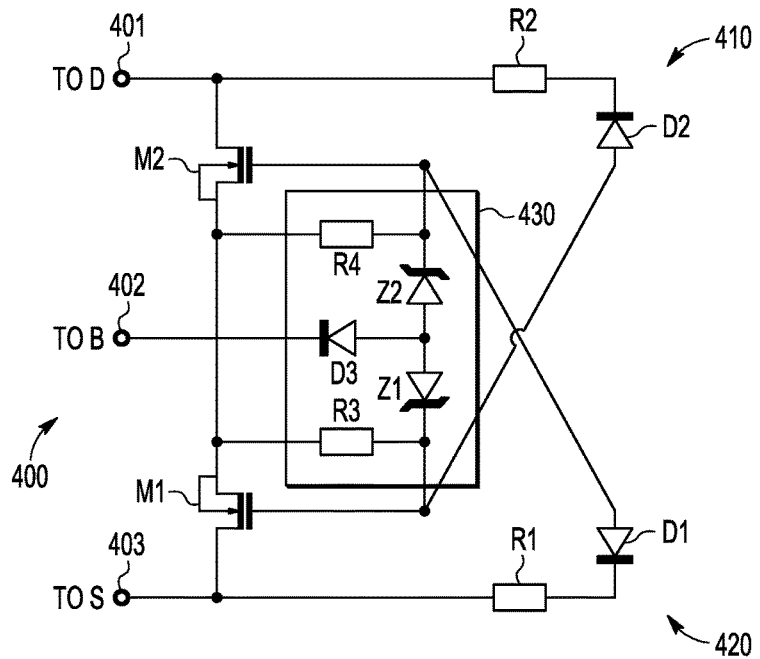
FIG. 5 schematically shows a circuit diagram of an example of an embodiment of a dynamic body control structure usable in the example of FIG. 4.
Figure 6:
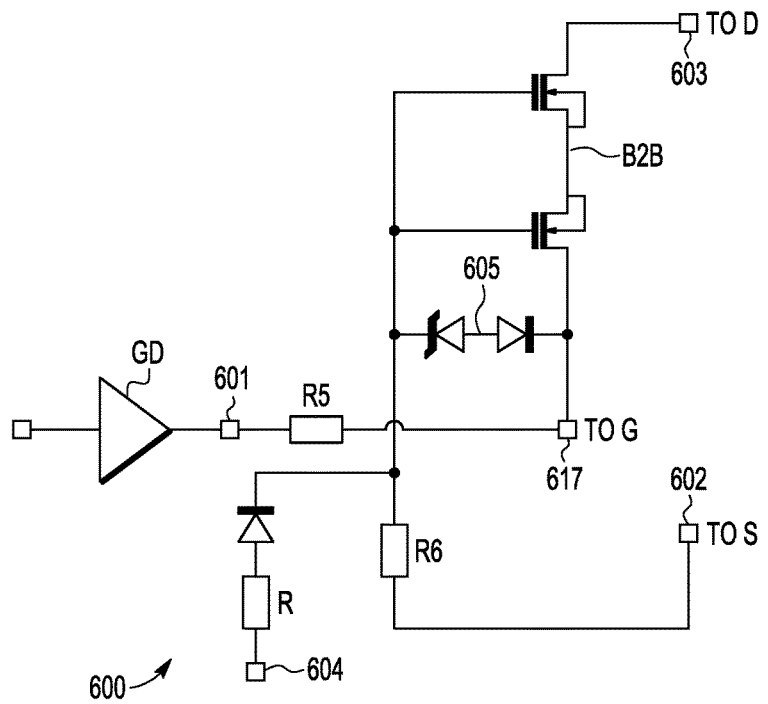
FIG. 6 schematically shows a circuit diagram of an example of a transistor control driver suitable for the example of FIG. 4.

The body control circuit 212 may be implemented in any manner suitable for the specific implementation, such as shown in FIG. 5. The example of a body control circuit 400 shown in FIG. 5 comprises first and second switches M1, M2, e.g. field effect transistors operated in switched mode, connectable between the body terminal B and a respective one of the first and second current terminals 102,103 of the bidirectional vertical power transistor T. The current flowing through the switches M1, M2 can be controlled through a respective control terminal, e.g. a gate, of the switch M1, M2. The control terminal of the first switch is connected to a first alternating current or transient, hereinafter AC, capacitive voltage divider 410 and the control terminal of the second switch is connected to a second AC capacitive voltage divider 420. The AC capacitive voltage dividers 410,420 are connectable dynamically to the current terminals D, S of the transistor. As shown the AC capacitive voltage dividers 410,420 are connected between respective contacts 401,403 of the circuit 400 connectable to the current terminals D, S. The AC capacitive voltage dividers 410,420, when in operation, control the switches M1, M2 to switch the voltage of the body terminal to the first current terminal or the second current terminal as a function of the voltage between the first current terminal and the second current terminal. At the control terminal of the switches M1, M2 a voltage will be applied that is only a fraction of the voltage between the current terminals D, S. Accordingly, the AC capacitive voltage dividers reduce the risk that the switches M1, M2 are damaged by a too high voltage applied to the current terminals D, S.

The AC capacitive voltage dividers 410,420 may both comprise a series connection of a resistor R1, R2 connectable to a respective current terminal of the transistor and at least two capacitive elements in series. A node between the capacitive elements can be connected to the control terminal and form the divided voltage node. In the example shown, a capacitive part of the switch M1, M2 to which the AC capacitive voltage divider 410,420 is connected is used as a capacitive element of the AC capacitive voltage. In this example, the switches M1, M2 are field effect transistors ((FETs), in this example n-type operated in depletion mode, and the inherent capacitance between the gate and body of the FET is used as a capacitive element of the voltage divider, between (in this example) source contact 403 and the divided voltage node for the first switch M1 and between drain contact 401 and the divided voltage node for the second switch M1. Thereby the need for an additional capacitive element in the circuit is avoided, which especially allows to reduce the size of the circuit when it is implemented as an integrated circuit since capacitors occupy a relative large amount of die surface.

The AC capacitive voltage divider in the example of FIG. 4 further has a diode D1 resp. D2 which is used as another capacitive element. The diode is connected with its cathode to the resistor R1,R2 and with an anode to the divided voltage node. Thus, when diode D1 connected to the second switch M2 is in reverse, i.e. the voltage of the source contact 403 is high, the gate of the second switch will receive a divided voltage $V_{g2}$ proportional to the ratio of the gate capacitance and the diode capacitance, and more specifically:

$$V_{g2} \propto \frac{C_{iss}^2}{C_{iss}^2 + C_{D1}} V_{out}$$

where the superscript 2 denotes the second switch M2, $V_{out}$ is the voltage between drain and source of the power transistor (i.e. the supply voltage0, and $C_{iss}^2$ is the transistor input capacitance or $C_{gd}^2 + C_{gs}^2$ of the second transistor M2. When the diode D1 is in forward mode (i.e. the voltage of the source contact 403 is low) the capacitance of the diode is high and the gate will receive a voltage below the threshold voltage. In this respect, it should be noted that the diode capacitance in reverse is mainly the junction capacitance whereas in the forward mode the diode capacitance is high because the junction capacitance increases due to the narrowing of the depletion layer, and the, far higher, diffusion capacitance adds to that. Accordingly, the AC capacitive voltage divider has a division ratio which varies depending on the polarity of the supply voltage.

The first switch M1 is operated in a similar manner relative to the drain contact 401, depending on the mode of the diode D2 (forward or reverse). Thus, when diode D2 connected to the first switch M1 is in reverse, i.e. the voltage of the drain contact 401 is high, the gate of the first switch M1 will receive proportional to the ratio of the gate capacitance $C_{iss}^1$ and the diode capacitance $C_{D2}$, and more specifically:

$$V_{g1} \propto \frac{C_{iss}^1}{C_{iss}^1 + C_{D2}} V_{out}$$

where the superscript 1 denotes the first switch M1. When the diode D2 is in forward mode (i.e. the voltage of the drain contact 401 is low) the capacitance of the diode is high and the gate will receive a voltage below the threshold voltage.

It will be apparent that a suitable value for the capacitance of the diodes D1,D2 may be set by choosing a suitable size of the diodes. Furthermore, a large resistance (of e.g. 1 MΩ or more) may be connected in parallel to the diode D1 and another large resistance (of e.g. 1 MΩ or more) may be connected in parallel to the diode D2. This allows a secure operation in a static situation, where the switching frequency is zero and polarity of the drain-source voltage does not change.

Still referring to FIG. 5, the body control circuit 400 can further comprise clamp circuitry 430 for clamping the control terminals of the switches M1, M2 relative to the body terminal B to below the breakdown voltage of the control terminal. In the example of FIG. 4, the clamp circuitry 430 comprises Zener diodes Z1,Z2 connected to each other with their anodes, while connected with the cathode to a respective one of the switches M1,M2. The Zener diodes Z1,Z2 clamp the control terminal of the switches M1, M2 relative to their anodes, while the anodes of the Zener diodes Z1,Z2 in turn are clamped relative to the body contact 402 by a diode D3 connected with its cathode to the body contact and with the anode to the anodes of the Zener diodes. The breakdown voltage of the Zener diode plus the forward voltage of the diode D3 are chosen to be below the breakdown voltage of the switches M1, M2, i.e. in case the switches are FETs to be below the gate oxide breakdown voltage BVox. For example, the clamping voltage may be 5 V when the gate oxide breakdown voltage BVox is 8 V.

Furthermore, the control terminals of the switches M1, M2 are connected to the body contact 402 through pull-down resistors R3,R4 which prevents the voltage of the control terminals from floating and thus ensures that the switches are always in a defined state.

The transistor control driver 213 may be implemented in any manner suitable for the specific implementation, such the driver circuit 600 as shown in FIG. 6 for instance. The driver 600 shown therein comprises a switch structure B2B connecting the second terminal contact 603 and the control contact 617 (connectable to node 217 when used in the example of FIG. 4). The switch structure B2B connects the control contact to the potential of the second terminal 603 in case the switch structure is closed, e.g. the structure shorts the gate to the drain, and isolates the control contact from the potential in case the switch structure is open. The switch structure B2B is controlled by the voltage of the second terminal contact 603 (connectable to node 218 when used in the example of FIG. 4) relative to the first terminal contact 602 (connectable to node 219 when used in the example of FIG. 4). It is found that this allows a very fast turn-off of the vertical bidirectional transistor and hence a very effective blocking of reverse current of the packaged unidirectional power transistor, compared to e.g. a classic resistor circuit that pulls the gate voltage to zero. For instance when a battery is connected in reverse in a car, such a fast turn-off is highly beneficial to protect the system in which the power transistor is used.

In the example of FIG. 6 for instance, the switch structure comprises a pair of nMOS transistors in a back-to-back configuration between the drain and gate of the bidirectional vertical power transistor T and with their gates connected through a current limiting resistor R6 to the source. Thus in case the source potential is above the drain voltage of the bidirectional vertical power transistors, the nMOS transistors turn on and the gate voltage is set and kept to the drain voltage. This, together with the reverse biasing of the body junction by the body control circuit 212 ensures that the bidirectional vertical power transistors blocks reverse current. Reversely if the source voltage is below the drain voltage the nMOS transistors are turned-off and the gate is electrically isolated from the drain, allowing to control a current flowing through the bidirectional vertical power transistor though gate driver GD in series with resistor R5 (which when used in the example of FIG. 4 may be positioned between nodes 215 and 217.

As shown, to protect the switch structure, the control circuit comprises a series connection 605 of a Zener diode connected back-to-back with a diode between the control contact and the first terminal contact. This limits the potential between gate and source of the back to back (B2B) transistors and hence protects the switching structure. To protect the switching structure from the first current terminal 602, a series connection of a resistor R and a diode is connected between ground node 604, connectable to ground (such as node 104 when used in the example of FIG. 4) which ensures that the gates of the NMOS are connected to ground when the source voltage becomes too negative.

In the foregoing specification, the invention has been described with reference to specific examples of embodiments of the invention. It will, however, be evident that various modifications and changes may be made therein without departing from the scope of the invention as set forth in the appended claims, and that the examples are not limiting thereto. For example, the semiconductor substrate described herein can be any semiconductor material or combinations of materials, such as gallium arsenide, silicon germanium, silicon-on-insulator (SOI), silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as meaning one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A packaged unidirectional power transistor, comprising:
    a package with a number of pins at an outside of the package, the pins being connected to an inside of the package to provide a voltage and/or current connection between the outside and the inside, the pins comprising a control pin, a first current pin and a second current pin;
    a bidirectional vertical power transistor inside the package, comprising:
        a controllable bidirectional current path, through a body of the bidirectional vertical power transistor, between a first current terminal of the bidirectional vertical power transistor connected to the first current pin and a second current terminal of the bidirectional vertical power transistor connected to the second current pin;
        a body terminal for controlling a voltage applied to the body; and
        a control terminal for selectively opening and closing said current path by a control voltage applied to the control terminal;
    a control circuit inside the package, the control circuitry including a transistor control driver connected to the control pin and the control terminal for driving the control terminal, the control circuitry including a body control circuit connected to the control pin and the body terminal for providing at the body terminal a body drive signal driving the body to allow current flow through the body in a forward direction, from the first current terminal to the second current terminal, as a function of the control voltage, and to block current flow in a reverse direction, reverse to the forward direction regardless of the control voltage,
    a first terminal contact connectable to the first current terminal of the bidirectional vertical power transistor;
    a second terminal contact connectable to the second current terminal; and
    wherein the body control circuit is connected to the first terminal contact and the second terminal contact and comprises a voltage detector to detect the polarity of a voltage between the first current terminal and the second current terminal to determine and to control the body as a function of the polarity.

2. The packaged unidirectional power transistor as claimed in claim 1, wherein the packaged unidirectional power transistor is a discrete transistor.

3. The packaged unidirectional power transistor as claimed in claim 1, comprising further circuitry inside the package for controlling the bidirectional vertical power transistor.

4. The packaged unidirectional power transistor as claimed in claim 3, wherein the further circuitry is configurable and/or programmable and the pins comprise at least one additional pin, additional to the control pin and the first and second current pins, connected to the further circuitry to configure and/or program the further circuitry.

5. The packaged unidirectional power transistor as claimed in claim 1, comprising at least two semiconductor dices comprising a power die and a control die, and wherein the bidirectional vertical power transistor is provided on the power die and the control circuit is provided on the control die.

6. The packaged unidirectional power transistor as claimed in claim 5, wherein the control die is stacked on the power die.

7. The packaged unidirectional power transistor as claimed in claim 1, comprising a switch structure connecting the second terminal contact to the control terminal and which switch structure connects the control terminal to the potential of the second terminal contact in case the switch structure is closed and isolates the control terminal from the potential in case the switch structure is open, the switch structure being controlled by the voltage of the second terminal contact relative to the first terminal contact.

8. The packaged unidirectional power transistor as claimed in claim 7, wherein the switch structure comprises a pair of transistors in a back-to-back configuration.

9. The packaged unidirectional power transistor as claimed in claim 7, comprising a Zener diode connected back-to-back with a diode between the control terminal and the switch structure.

10. The packaged unidirectional power transistor as claimed in claim 7, comprising a current path from ground to the switch structure, and protective circuitry in the current path which protects the switch structure from a negative over voltage at the first current terminal.

11. The packaged unidirectional power transistor as claimed in claim 1, wherein the bidirectional vertical power transistor includes a layer stack comprising a first drift layer over a body layer over a second drift layer and includes a vertical trench defining a gate disposed horizontally adjacent the body layer, the gate connected to the control terminal.

12. The packaged unidirectional power transistor as claimed in claim 11, wherein the bidirectional vertical power transistor further includes a shield plate defined in the vertical trench and connected to a shield electrode.

13. A control circuit for a unidirectional power transistor, the control circuit being connectable to a bidirectional vertical power transistor having a body terminal for controlling a voltage applied to a body of the bidirectional vertical power transistor, a control terminal for controlling a current flowing through the body via a controllable bidirectional current path between a first current terminal of the bidirectional vertical power transistor connected to the first current pin and a second current terminal of the bidirectional vertical power transistor connected to the second current pin, said control circuit comprising:

a control input for receiving a transistor control signal;
a body contact connectable to the body terminal;
a control contact connectable to the control terminal;
a transistor control driver connected to the control input, for driving the control terminal based on the control signal provided at the control input;
a body control circuit connected to the control input and the body contact, for providing at the body contact a body drive signal driving the body to allow current flow through the body in a forward direction from the first current terminal to the second terminal as a function of a control voltage of the control terminal and to block current flow in a reverse direction reverse to the forward direction regardless of the control voltage;
a first terminal contact connectable to the first terminal of the bidirectional vertical power transistor; and
a second terminal contact connectable to the second terminal, and wherein the body control circuit is connected to the first terminal contact and the second terminal contact and comprises a voltage detector to detect the polarity of a voltage between the first terminal and the second terminal to determine and to control the body as a function of the polarity.

14. The control circuit as claimed in claim 13, wherein the body drive signal forward or reverse biases a junction in the body.

15. The control circuit as claimed in claim 14, wherein the junction, when reverse biased, blocks the current flow in the reverse direction.

16. The control circuit as claimed in claim 13, comprising a switch structure connecting the second terminal contact to the control contact and which switch structure connects the control contact to the potential of the second terminal contact in case the switch structure is closed and isolates the control contact from the potential in case the switch structure is open, the switch structure being controlled by the voltage of the second terminal contact relative to the first terminal contact.

17. The control circuit as claimed in claim 16, wherein the switch structure comprises a pair of transistors in a back-to-back configuration.

18. The control circuit as claimed in claim 16, comprising a Zener diode connected back-to-back with a diode between the control contact and the switch structure.

19. The control circuit as claimed in claim 16, comprising a current path from ground to the switch structure, and protective circuitry in the current path which protects the switch structure from a negative over voltage at the first current terminal.

20. The control circuit as claimed in claim 13, comprising:
a first switch connectable between the body contact and the first current terminal contact, comprising a control terminal for controlling the current flowing through the first switch;
a second switch connectable between the body contact and a second current contact, comprising a control terminal for controlling the current flowing through the second switch;
the first switch and the second switching, when in operation, the voltage of the body terminal to the first current terminal or the second current terminal as a function of the voltage between the first current terminal and the second current terminal.

* * * * *